(12) United States Patent
Rajendran et al.

(10) Patent No.: US 8,265,912 B2
(45) Date of Patent: Sep. 11, 2012

(54) METHOD FOR MODELING A MOUNTING ASSEMBLY AND A MOUNTING ASSEMBLY

(75) Inventors: Ashok Rajendran, Tamil Nadu (IN); Chijie Lin, Houston, TX (US); Chunhui Pan, Dunlap, IL (US)

(73) Assignee: Caterpillar Inc., Peoria, IL (US)

( * ) Notice: Subject to any disclaimer, the term of this patent is extended or adjusted under 35 U.S.C. 154(b) by 899 days.

(21) Appl. No.: 12/318,005

(22) Filed: Dec. 19, 2008

(65) Prior Publication Data
US 2010/0161248 A1   Jun. 24, 2010

(51) Int. Cl.
*G06G 7/48* (2006.01)
(52) U.S. Cl. .............. 703/7; 703/1; 73/804; 702/34
(58) Field of Classification Search ............... 703/7
See application file for complete search history.

(56) References Cited

U.S. PATENT DOCUMENTS

| | | | |
|---|---|---|---|
| 5,961,248 A * | 10/1999 | Tourtellotte | 403/400 |
| 6,077,302 A | 6/2000 | Kumra et al. | |
| 6,304,829 B1 | 10/2001 | Whittle et al. | |
| 6,351,998 B1 | 3/2002 | Hohnstadt et al. | |
| 6,510,744 B1 | 1/2003 | Hayatsu | |
| 6,535,832 B2 | 3/2003 | Page et al. | |
| 6,704,664 B2 | 3/2004 | Su et al. | |
| 6,904,399 B2 | 6/2005 | Cooper et al. | |
| 6,925,416 B2 | 8/2005 | Miyamoto et al. | |
| 7,219,044 B1 | 5/2007 | Prevey et al. | |
| 2002/0145095 A1 * | 10/2002 | Winkler | 248/300 |
| 2004/0011615 A1 * | 1/2004 | Ray et al. | 188/374 |
| 2008/0156569 A1 | 7/2008 | Clevenger et al. | |

OTHER PUBLICATIONS

Webster et al, "Tolerance of NGV Container Designs to Damage Induced Under Mounting Bracket Straps", Topical Report, 1997, ABS Only.*
Colclough, S., "Random Vibration Analysis of the XM21 Decontaminant Pumper Module of the Modular Decontamination System" Engineering Directorate, Edgewood Research, Development & Engineering Center, Feb. 1998.*
Webster et al, "Tolerance of NGV Container Designs to Damage Induced Under Mounting Bracket Straps", Topical Report, 1997.*
U.S. Appl. No. 11/826,614, filed Jul. 17, 2007, 35 pages.

* cited by examiner

*Primary Examiner* — Mary C Jacob
(74) *Attorney, Agent, or Firm* — Finnegan, Henderson, Farabow, Garrett & Dunner LLP

(57) ABSTRACT

The present disclosure is directed to a computer-implemented method for modeling a mounting assembly having a mounting strap configured to couple a component to a bracket. The method includes modeling a loosened configuration of the mounting strap, wherein the loosened configuration provides a first substantially continuous curvature of portions of the mounting strap engaged with the bracket and the component. The method also includes applying simulated stresses to the mounting strap in the loosened configuration and outputting failure mode information of the mounting strap based on the simulated stresses on the mounting strap.

20 Claims, 6 Drawing Sheets

METHOD FOR MODELING A MOUNTING ASSEMBLY AND A MOUNTING ASSEMBLY

TECHNICAL FIELD

The present disclosure is directed to a method for modeling a mounting assembly and a mounting assembly and, more particularly, a method for modeling a mounting strap of a mounting assembly in a loosened configuration and a mounting assembly design having a mounting strap and based on an analysis of the mounting strap in a loosened configuration.

BACKGROUND

Many computer-based applications exist for aiding in the design of products. Using these applications, an engineer can construct a computer model of a particular product and can analyze the behavior of the product through various analysis techniques. Further, certain analytical tools have been developed that enable engineers to evaluate and test multiple design configurations of a product.

For example, a mounting assembly for mounting a component via a strap to a mounting bracket may be modeled for design purposes. The mounting assembly may be initially modeled in an engaged position, where the strap is "tightened" and couples the component to the mounting bracket. An analytical tool, such as, for example, a finite element analysis (FEA) application, may test design configurations of the strap against requirements relating to stress and strain, vibration response, modal frequencies, and stability to predict the failure and fatigue life of the strap in terms of specific design parameters. The data from the analytical tool may then be used to provide insight on how specific design parameters of the mounting assembly can be modified to increase the fatigue life of the strap.

Several drawbacks result from this approach. For example, certain design parameters and conditions of the strap, such as the influence of a discontinuous and bent shape of the strap in the "tightened" condition, may not be accounted for. This may provide an inaccurate stress analysis of the strap and also a mounting assembly design which is not appropriate.

One attempt to incorporate and account for existing design conditions in the design of products is disclosed in U.S. Pat. No. 7,219,044 B1 issued to Prevey et al. on May 15, 2007 (the '044 patent). The '044 patent discloses a method for designing a part with improved fatigue life in which residual stresses developed during the manufacturing of the part are accounted for. A total stress state of the part is determined based on the sum residual stresses and applied stresses acting on the part. Compressive forces then are modeled to offset the effects of the residual stresses on the part.

Although the method of the '044 patent may take into account residual stresses due to manufacturing in predicting fatigue life of products, it may have limitations. For example, the method fails to account for the initial shape of the modeled part prior to modeling its assembly and engagement and applying simulated stresses.

The method of the present disclosure is directed towards improvements to existing technology.

SUMMARY OF THE DISCLOSURE

One aspect of the present disclosure may be directed to a computer-implemented method for modeling a mounting assembly having a mounting strap configured to couple a component to a bracket. The method may include modeling a loosened configuration of the mounting strap, wherein the loosened configuration provides a first substantially continuous curvature of portions of the mounting strap engaged with the bracket and the component. The method may also include applying simulated stresses to the mounting strap in the loosened configuration and outputting failure mode information of the mounting strap based on the simulated stresses on the mounting strap.

Another aspect of the present disclosure may be directed to a computer-implemented method for modeling a mounting assembly including a mounting strap configured to couple a component to a bracket. The method may include modeling a loosened configuration of the mounting strap, wherein the loosened configuration provides a first substantially continuous curvature of portions of the mounting strap engaged with the bracket and the component. The method may also include applying simulated stresses to the mounting strap in the loosened configuration. The method may further include outputting failure mode information of the mounting strap based on the simulated stresses on the mounting strap and modifying a design of the mounting assembly based on the configuration of the modeled loosened mounting strap.

DETAILED DESCRIPTION

Figure 1:
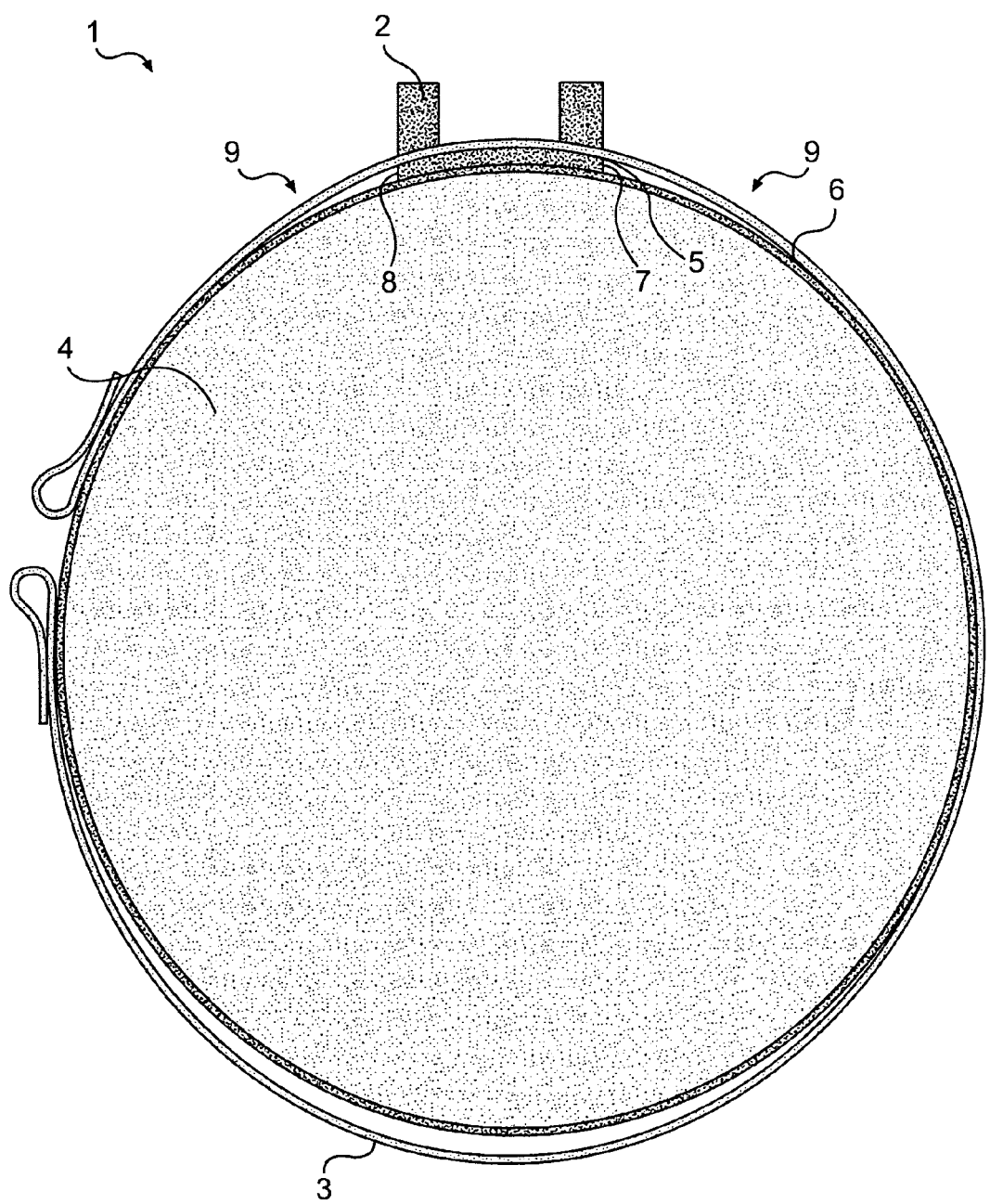
FIG. 1 is a diagrammatic model of a mounting assembly according to an exemplary disclosed embodiment.

FIG. 1 illustrates a model of an exemplary disclosed mounting assembly 1. Mounting assembly 1 may include a mounting bracket 2 and a mounting strap 3. Mounting strap 3 may be modeled to engage the outer surface of a component 4 and modeled to couple component 4 to mounting bracket 2. Mounting bracket 2 may be modeled to include a first edge 7 and a second edge 8. As illustrated in FIG. 1, mounting strap 3 may be modeled in a loosened or unengaged configuration, where component 4 rests between mounting bracket 2 and mounting strap 3 with no tension applied to mounting strap 3 to fixedly fasten component 4 to mounting bracket 2. Mounting assembly 1 may also be modeled to also include a first point of engagement 5 and a second point of engagement 6. First point of engagement 5 may modeled to be a contact point between mounting strap 3 and first edge 7. Second point of engagement 6 may be modeled to be a contact point between mounting strap 3 and component 4 at a location closest to first edge 7 of mounting bracket 2. Although not shown in FIG. 1, it will be understood that similar points of engagement may be associated with a second edge 8 of mounting bracket 2. That is, mounting strap 3 may be modeled to contact a point on second edge 8 and a point between mounting strap 3 and component 4 at a location closest to second edge 8. In the loosened configuration, portions of mounting strap 3 modeled to engage mounting bracket 2 and component 4 may have a substantially continuous curvature 9. For example, portions of mounting strap 3 between first point of engagement 5 and second point of engagement 6, for example, may be modeled to maintain a substantially smooth curve with the rest of mounting strap 3.

Figure 2:
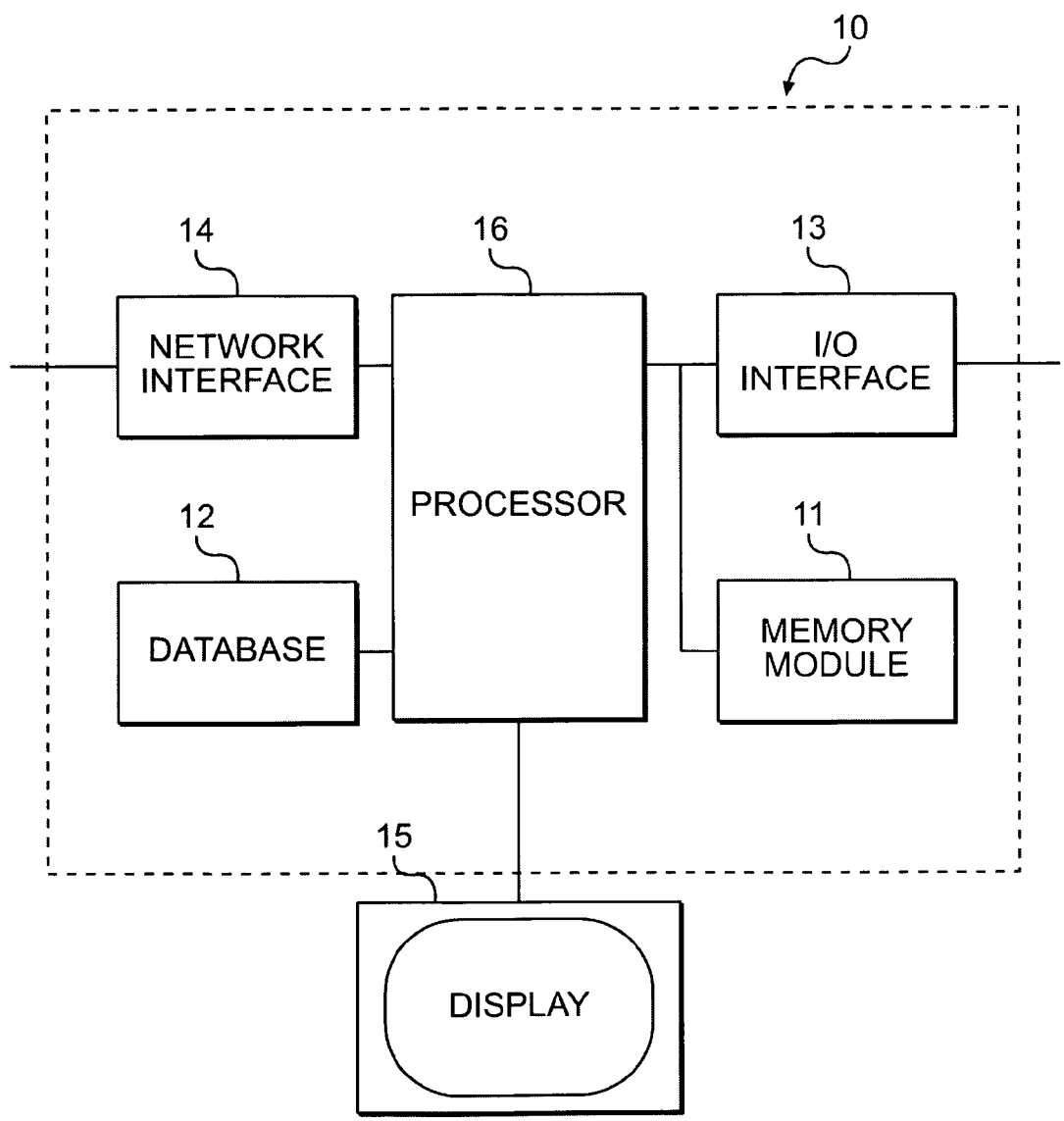
FIG. 2 is a block diagram representation of a product design system according to an exemplary disclosed embodiment.

FIG. 2 illustrates a block diagram representation of a product design system 10 for generating a design and model of a product, such as the model of mounting assembly 1 illustrated in FIG. 1. A product may also refer to any object that includes a single part or an assembly comprised of multiple parts.

Product design system 10 may include a processor 16, a memory module 11, a database 12, an I/O interface 13, and a network interface 14. Product design system 10 may also include a display 15. Any other components suitable for receiving and interacting with data, executing instructions, communicating with one or more external workstations, displaying information, etc., may also be included in product design system 10.

Processor 16 may include any appropriate type of general purpose microprocessor, digital signal processor, or microcontroller. Memory module 11 may include one or more memory devices including, but not limited to, a ROM, a flash memory, a dynamic RAM, and a static RAM. Memory module 11 may be configured to store information accessed and used by processor 16. Database 12 may include any type of appropriate database containing information relating to characteristics of input parameters, output parameters, mathematical models, and/or any other control information. I/O interface 13 may be connected to various data input devices (e.g., keyboards, pointers, drawing tablets, etc.) (not shown) to provide data and control information to product design system 10. Network interface 14 may include any appropriate type of network adaptor capable of communicating with other computer systems based on one or more communication protocols. Display 15 may include any type of device (e.g., CRT monitors, LCD screens, etc.) capable of graphically depicting information.

Figure 3:
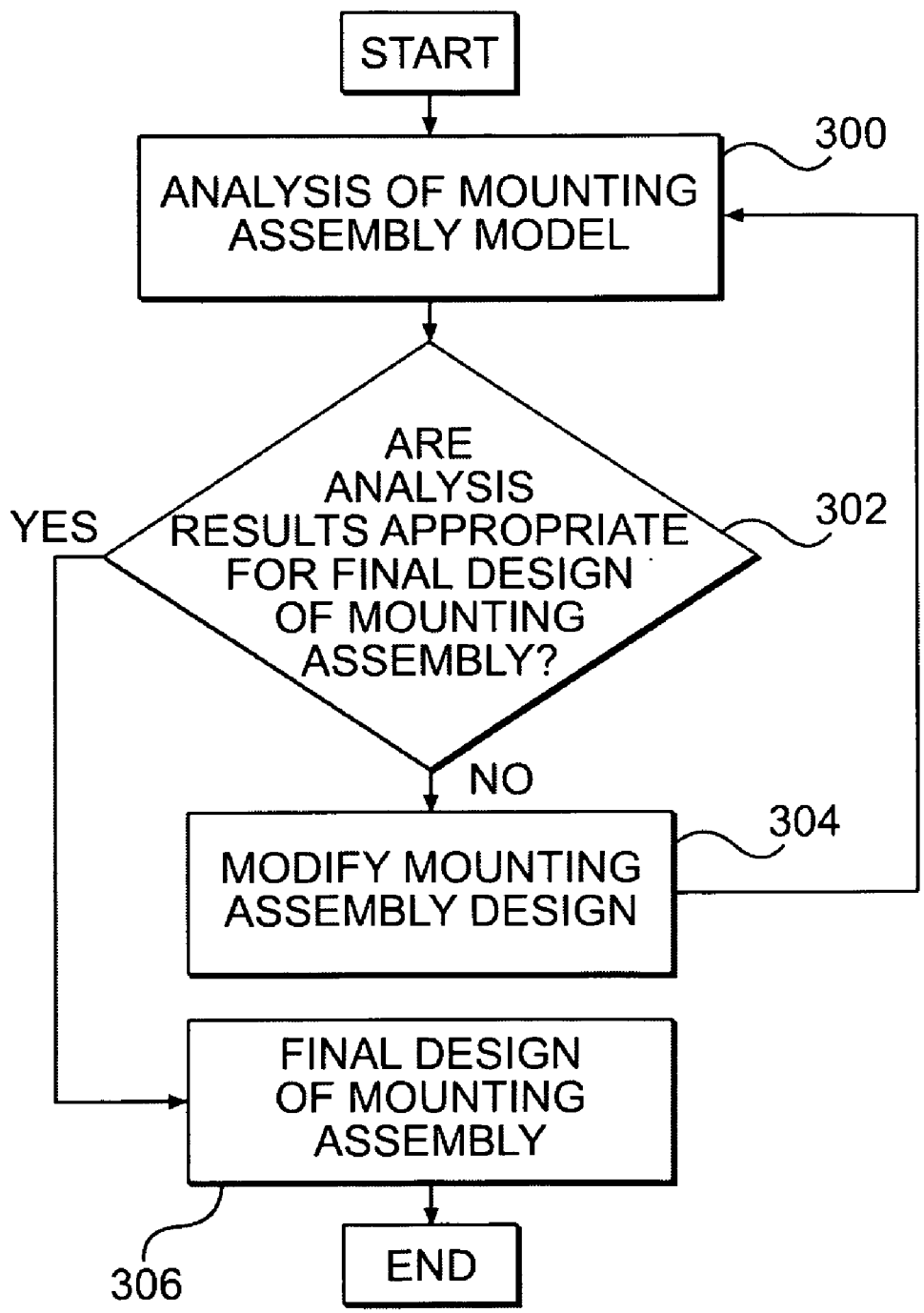
FIG. 3 is a flow chart briefly describing an exemplary disclosed method for modeling a mounting assembly according to an exemplary disclosed embodiment.

FIG. 3 illustrates a flow chart briefly describing an exemplary disclosed method for modeling mounting assembly 1 using product design system 10. Analysis of a model of mounting assembly 1 may be performed at step 300. In one embodiment, analysis of mounting assembly 1 modeled in the loosened configuration, as illustrated in FIG. 1, may be performed. Desired design parameters may be inputted into product design system 10 to develop the model of the mounting assembly 1. The design parameters may include, for example, dimensions, tolerances, masses, material selections, or any other characteristics affecting one or more design properties of the mounting assembly 1. The model may include, for example, a graphical image and/or a finite element model of mounting assembly 1. A fatigue analysis then may be performed to determine and output failure mode information, such as fatigue life and stress magnitudes of mounting strap 3 modeled in the loosened configuration. For example, failure mode information may be outputted by processor 16 to be stored as data in memory module 11 or to be displayed as an image on display 15 of product design system 10. At step 302, product design system 10 may determine if the analysis results determined in step 300 are appropriate for a final design of mounting assembly 1. Product design system 10 may, for example, utilize stored algorithms, equations, subroutines, look-up maps, and/or tables to analyze and determine if the failure mode information is appropriate. In one example, product design system 10 may determine if failure mode information, such as stress magnitudes and/or fatigue life, are within a desired range.

Figure 6:
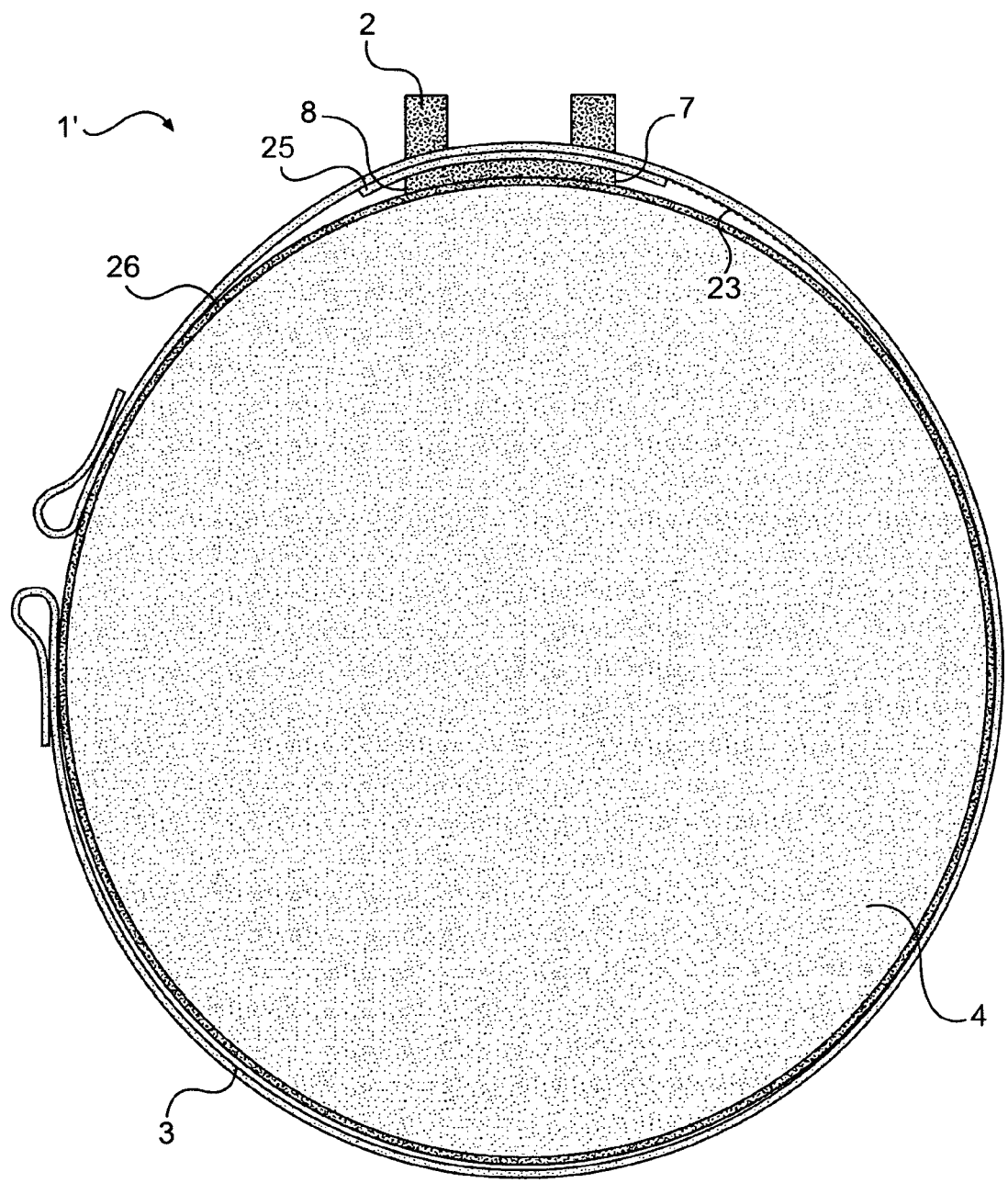
FIG. 6 is a diagrammatic model of another mounting assembly according to an exemplary disclosed embodiment.

If the analysis results are not appropriate, the design of mounting assembly 1 may be modified at step 304. In one embodiment, modified design parameters of mounting assembly 1 may be inputted into product design system 10. For example, the thickness and/or curvature of loosened mounting strap 3 may be modified. Additionally or alternatively, the model of mounting assembly 1 in the loosened configuration may be utilized to develop additional components for a modified mounting assembly design. For example, a strap support 25, as illustrated in FIG. 6, may be designed based on the model of mounting assembly 1 in the loosened configuration to alleviate stress to mounting strap 3. Once the design of mounting assembly 1 is modified, product design system 10 then may analyze the modified model of mounting assembly 1 (step 300) and determine if the analysis results are appropriate (step 302).

If product design system 10 determines that the analysis results are acceptable, the model of mounting assembly 1 analyzed in step 300 may be established as a final design of mounting assembly 1 at step 306. The final design may be utilized for further analysis, such as testing the effects of further modifications to the design parameters, or may be outputted by processor 16 as data and stored within memory module 11 for future analysis of mounting assembly 1. It is also contemplated that processor 16 may output the final design as a graphical image on display 15.

Figure 4:
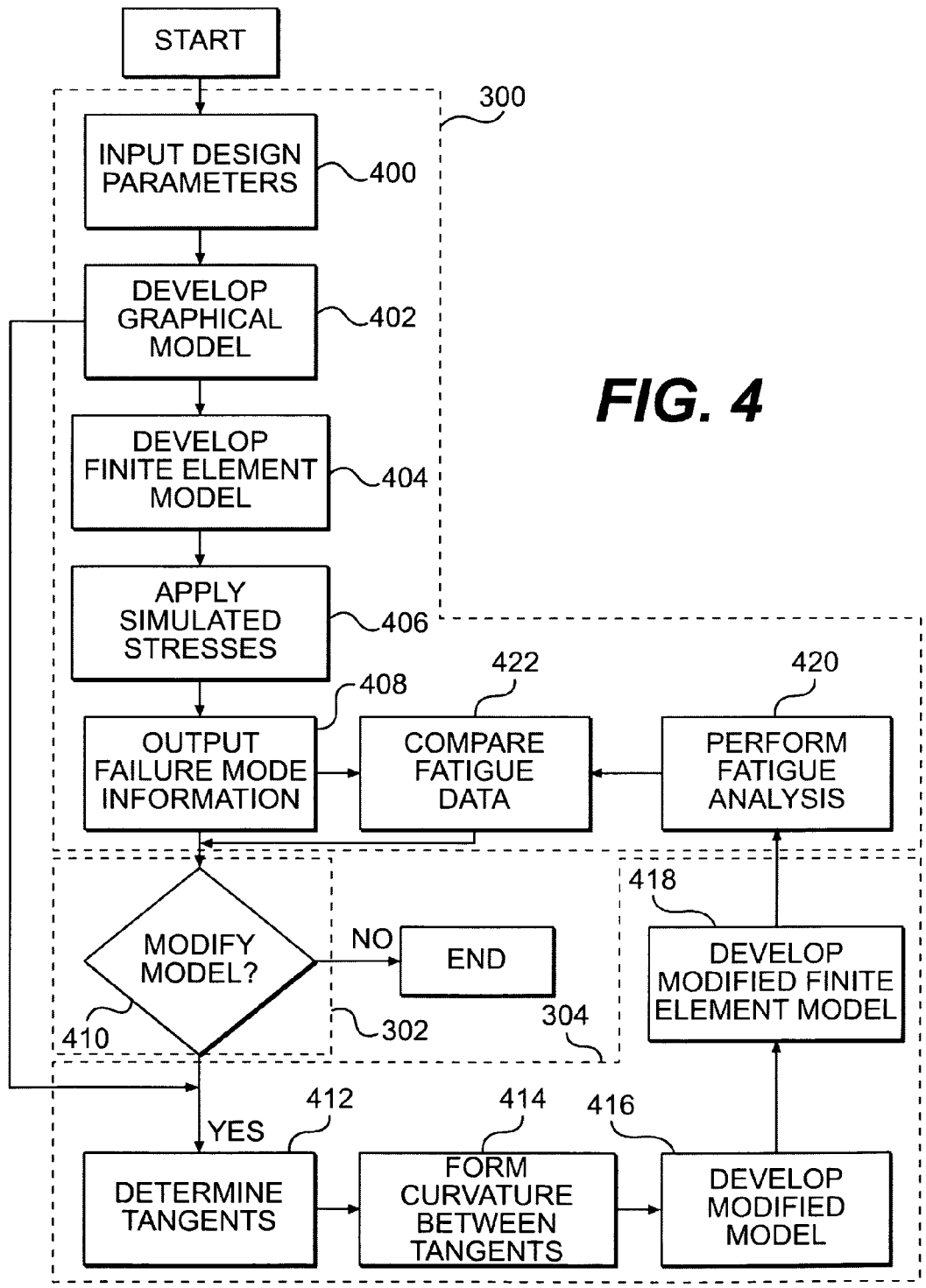
FIG. 4 is a flow chart describing an exemplary disclosed method for modeling a mounting assembly according to an exemplary disclosed embodiment in detail.

FIG. 4 illustrates a flow chart describing the exemplary disclosed method for modeling mounting assembly 1 using product design system 10 in greater detail. As illustrated in FIG. 4, and also with reference to FIG. 3, analysis of the mounting assembly model (step 300 of FIG. 3) may include step 400. At step 400, desired design parameters associated with mounting assembly 1, as illustrated in the model of FIG. 1, may be inputted into processor 16 via I/O interface 13, retrieved from database 12, and/or retrieved from other computers via network interface 14. In one embodiment, design parameters may include, for example, coordinate locations, curve criteria, masses of the mounting assembly components, tensile strengths, and dimensional data related to mounting assembly 1, such as mounting strap 3 inner and outer diameters, mounting strap 3 thickness, component 4 diameter, mounting bracket 2 length and height, and any other dimensions associated with mounting assembly 1. Design parameters may further include input data associated with material selection of mounting assembly 1. For example, parameters modeling and describing mounting strap 3 and mounting bracket as flexible materials may be inputted into product design system 10, with the degree of flexibility modified as desired.

Coordinate locations and curve criteria may be related to the shape of mounting strap 3, in, for example, the loosened configuration. Coordinate locations may include points in a two-dimensional space, such as a 2-D Cartesian coordinate system, associated with locations of mounting strap 3 relative to mounting bracket 2 and component 4. Coordinate locations may include, for example, first point of engagement 5 and second point of engagement 6, as shown in FIG. 1.

Curve criteria may include data and coordinate locations related to the substantially continuous curved shape of mounting strap 3 in the loosened configuration. In one embodiment, curve criteria may include a third-order polynomial indicating the coordinate locations of the substantially continuous curvature 9 between first point of engagement 5 and second point of engagement 6. It should also be appreciated that the third-order polynomial may also indicate mounting strap 3 points of engagement associated with second edge 8 of mounting bracket 2, as discussed above. The third-order polynomial may be an equation expressed as:

$$y=ax^3+bx^2+cx+d$$

where y may be a vertical coordinate and x may be a horizontal coordinate in the two-dimensional space. The derivative (y') of the third-order polynomial may be expressed as:

$$y'=3ax^2+2bx+c$$

Coefficients a, b, c, and d may be determined by inputting two different sets of boundary conditions for x and y into the third-order polynomial and two different sets of boundary conditions for x and y' into the derivative of the third-order polynomial. This will generate a system of four linear equations having four variables (a, b, c, and d) to solve for. In one embodiment, the four boundary conditions may include the x-coordinate (x-value) and the y-coordinate (y-value) of first point of engagement 5, the x-coordinate (x-value) of first point of engagement 5 and the slope of the curve at first point of engagement 5 (y'-value), the x-coordinate (x-value) and the y-coordinate (y-value) of second point of engagement 6, and the x-coordinate (x-value) of second point of engagement 6 and the slope of the curve at second point of engagement 6 (y'-value). In one exemplary embodiment, values of the coefficients are shown below, with $R_A$ being equal to a radius extending from the center of component 4 to mounting bracket 2, for example, $R_A$ may be equal to the distance between the center of component 4 and first point of engagement 5. $R_B$ may be equal to a radius extending from the center of component 4 to the outer surface of component 4, for example, $R_B$ may be equal to the distance between the center of component 4 and second point of engagement 6, with $R_A$ and $R_B$ being separated by 30 degrees:

$$a = \frac{1}{3R_B^2}\left[-28\sqrt{3} + 48\frac{R_A}{R_B}\right];$$

$$b = \frac{1}{6R_B}\left[40\sqrt{3} - 72\frac{R_A}{R_B}\right];$$

$$c = 0; \text{ and}$$

$$d = R_A$$

Curve criteria may also include data and coordinate locations related to the continuous curvature of mounting strap 3 extending from second point of engagement 6 and away from first point of engagement 5. For example, curve criteria may include an equation of a circle to indicate the coordinate locations of the curvature. The equation may be expressed as:

$$x^2+y^2=R_B^2$$

where x and y may be the horizontal and vertical coordinates, respectively, of mounting strap 3 extending from second point of engagement 6 and away from first point of engagement 5. It should be appreciated that the equation of a circle may be utilized in a similar fashion to provide data and coordinate locations related to the continuous curvature of mounting strap 3 extending between the points of engagement associated with second edge 8, as discussed above. The equation may also be applied to portions of mounting strap 3 engaged with mounting bracket 2 between first edge 7 and second edge 8.

As illustrated in FIG. 4, and also with reference to FIG. 3, analysis of the mounting assembly model (step 300 of FIG. 3) may also include step 402. At step 402, product design system 10 may process the design parameters from step 400 to develop the graphical model of mounting assembly 1. Processor 16 may, for example, manipulate and convert the inputted design parameters into a graphical image of mounting assembly 1, which may be displayed on display 15. In one embodiment, processor 16 may include computer aided engineering software, such as HYPERMESH, PRO-E®, or any other computer aided engineering software known in the art, to model the geometry and shape of mounting assembly 1, wherein mounting strap 3 may be modeled in the loosened configuration.

Analysis of the mounting assembly model (step 300 of FIG. 3) may also include determining a finite element model of mounting assembly 1, as illustrated in FIG. 4 at step 404. The model of mounting assembly 1 developed in step 402 may be represented in the finite element model. Processor 16 may include analytical applications or software, such as HYPERMESH, ABAQUS, or any other analytical software known in the art, to process the geometric and design data of mounting assembly 1 and generate the finite element model.

As discussed above and with reference to FIG. 3, analysis of the mounting assembly model (step 300) may include performing a fatigue analysis of the mounting assembly model. For example, and as shown at step 406 of FIG. 4, product design system 10 may apply a simulated stress to the finite element model and determine stress distributions of mounting strap 3 in the loosened configuration. Product design system 10 then may indicate the distribution and magnitude of the simulated stress in regions of mounting strap 3. Failure sensitive areas of mounting strap 3, which may be indicated by regions of mounting strap 3 having the largest magnitudes of simulated stress, may be stored in memory module 11 as coordinate locations. The magnitudes of the stresses may also be determined and stored in memory module 11. Additionally or alternatively, modal analysis of the finite element model may identify regions of mounting strap 3 which may be sensitive to fatigue and failure. Stress distributions along mounting strap 3 in its natural modal shapes during free vibrations may indicate the fatigue sensitive regions. The natural frequencies of mounting strap 3 during free vibrations may also be determined by the modal analysis and stored in memory module 11. The failure sensitive regions determined by the normal modal analysis may also be stored in memory module 11 as coordinate locations. Additionally or alternatively, simulated stresses, such as random stress cycles of vibration, may be applied to the finite element model of mounting strap 3. The vibrations may match the natural frequencies of mounting strap 3, which may simulate resonance causing excessive stress on and subsequent failure of mounting strap 3.

Analysis of the mounting assembly model (step 300 of FIG. 3) may also include outputting failure mode information, as shown in FIG. 4 at step 408. For example, stress distributions and/or stress amplitude levels generated by the vibrations and the number of cycles to reach failure may be monitored and outputted by processor 16 and may be stored as data in memory module 11 or may be displayed on display 15. In addition, a relationship between the stress amplitude levels and the number of cycles may be developed in the form of a stress versus cycles to failure curve (S-N curve). The stress distributions and the fatigue sensitive regions of mounting strap 3 may also be monitored as the vibrational stress cycles are applied. Changes in stress magnitude and distribution on mounting strap 3 then may be determined and outputted. Failure points of mounting strap 3 may then be identified based on the stress distributions resulting from the applied cycles of vibration and may be stored as coordinate locations in memory module 11 or displayed on display 15. In one exemplary embodiment, the failure points of mounting strap 3 may be associated with points of contact with mounting bracket 2. For example, and with reference to FIG. 1, a failure point of mounting strap 3 may be located at first point of engagement 5, wherein the pointed configuration of first edge 7 of mounting bracket 2 may induce excess stress to mounting strap 3 resulting in failure at first point of engagement 5.

At step 410, and also with reference to FIG. 3, product design system 10 may determine whether modifications to the mounting assembly model are appropriate based on the analysis results of the mounting assembly model (step 302 of FIG. 3). For example, if the failure mode information outputted in step 408 is not appropriate, modified design parameters may be inputted into product design system 10 until an appropriate, final design of mounting assembly 1 in the loosened configuration is developed. If the appropriate, final design of mounting assembly 1 is developed, processor 16 may end the modeling and analysis of mounting assembly 1 and output the final design of mounting assembly 1 as data for storage within memory module 11 for future analysis of mounting assembly 1 in the loosened configuration. It is also contemplated that processor 16 may output the final design of mounting assembly 1 to be displayed as a graphical image on display 15. Additionally or alternatively, product design system 10 may modify the model of mounting assembly 1 to develop a mounting assembly design having minimized stress at the failure points of mounting strap 3. If modifying mounting assembly 1 is chosen, design modifications may be initiated at step 412.

Figure 5:
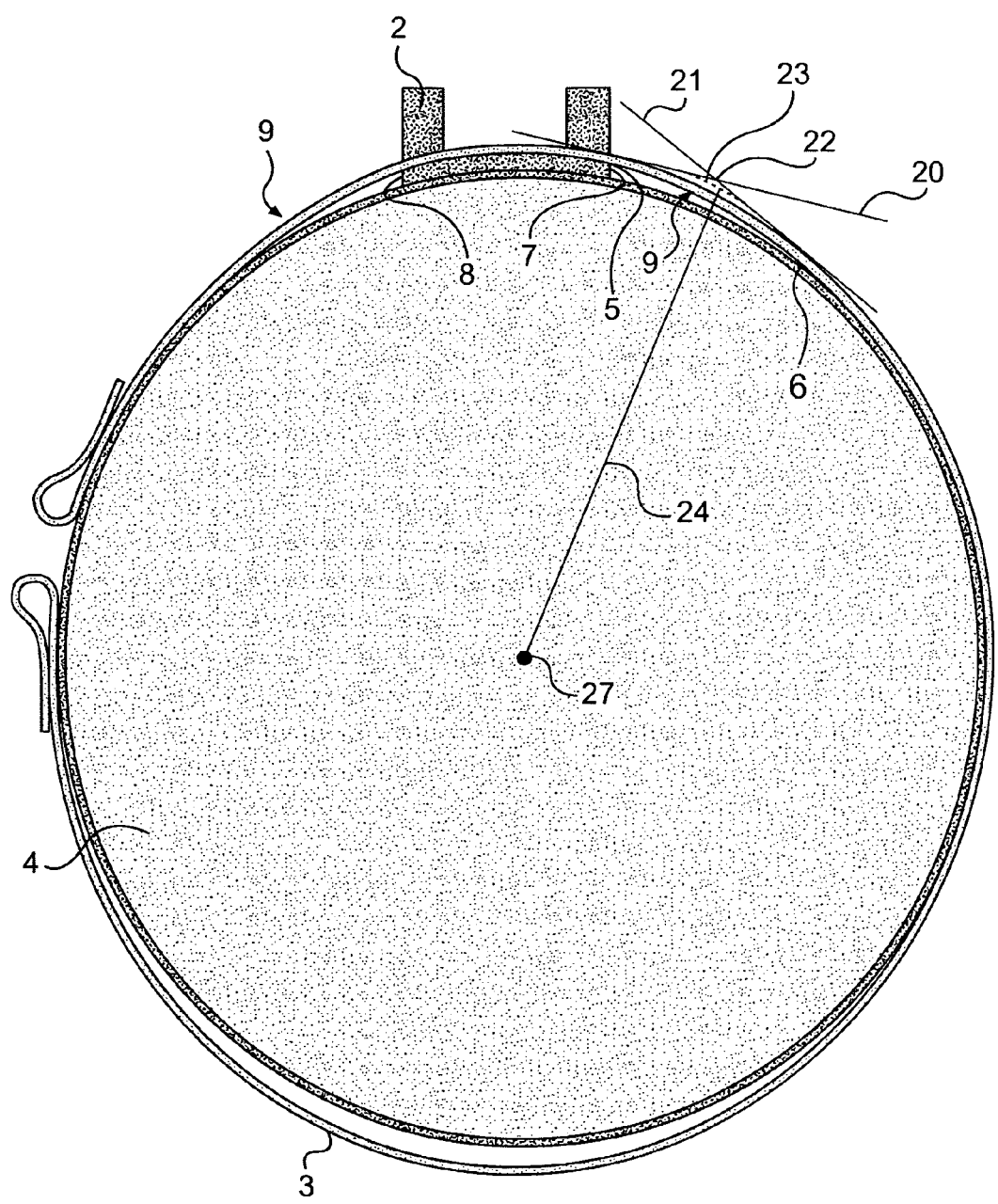
FIG. 5 is another diagrammatic model of the mounting assembly of FIG. 1 according to an exemplary disclosed embodiment.

In one embodiment, modifying the design of mounting assembly 1 (step 304 of FIG. 3) may include steps 412, 414, 416 and 418, as illustrated in FIG. 4. At step 412, and also with reference to FIG. 5, processor 16 may manipulate the graphical model of mounting assembly 1 developed in step 402 to determine a first tangent 20 at first point of engagement 5 and a second tangent 21 at second point of engagement 6. First tangent 20 and second tangent 21 may be positioned on the outer circumference of mounting strap 3, as illustrated in FIG. 5. Additionally or alternatively, first tangent 20 and second tangent 21 may be positioned on the inner circumference of mounting strap 3. Although not shown in FIG. 5, it should be appreciated that tangents at points of engagement associated with second edge 8, as described above, may also be determined in a similar fashion. Processor 16 may utilize the computer aided engineering software to determine the locations of first tangent 20 and second tangent 21 relative to mounting strap 3 and may extend first and second tangents 20, 21 from mounting assembly 1 to an intersection point 22.

At step 414, and also with reference to FIG. 5, processor 16 may utilize the computer aided engineering software to manipulate first and second tangents 20, 21 and form a substantially continuous curvature 23 between first and second tangents 20, 21 as a function of intersection point 22. Intersection point 22 formed by first and second tangents 20, 21 may be rounded so that substantially continuous curvature 23 extends between first and second tangents 20, 21. It should be appreciated that the location of substantially continuous curvature 23 relative to intersection point 22 may be modified based on a user inputted distance 24. For example, substantially continuous curvature 23 may be formed closer to or away from intersection point 22 depending on the length of distance 24 from a center 27 of component 4 to the tip of substantially continuous curvature 23. In one embodiment, distance 24 may be substantially equal to the distance from center 27 of component 4 to a point on the outer surface of mounting strap 3 and substantially aligned with intersection point 22. Although not shown in FIG. 5, processor 16 may also form and model a substantially continuous curvature based on the tangents at points of engagement associated with second edge 8 in a similar manner as described above. Substantially continuous curvature 23 may then be used to model an additional structure for mounting assembly 1 to minimize stress and failure to mounting strap 3.

At step 416, and also with reference to FIG. 6, processor 16 may model a modified mounting assembly 1'. Modified mounting assembly 1' may include mounting bracket 2, mounting strap 3, and strap support 25. Strap support 25 may be modeled as a structure, such as a sheath or a strap, configured to support mounting strap 3 against mounting bracket 2. Strap support 25 may be modeled based on the analysis of mounting strap 3 in the loosened configuration. For example, strap support 25 may be modeled as a function of substantially continuous curvature 23, wherein strap support 25 may be modeled to include a curved configuration which follows substantially continuous curvature 23. That is, strap support 25 may extend from mounting bracket 2 and along the path of substantially continuous curvature 23. As illustrated in FIG. 6, the top surface of strap support 25 may be modeled to follow and be substantially aligned with substantially continuous curvature 23. Similarly, strap support 25 may be modeled to follow the substantially continuous curvature associated with second edge 8. Strap support 25 may be modeled to engage mounting bracket 2 and may extend from first edge 7 and second edge 8 of mounting bracket 2 relative to a circumference 26 of component 4. Although FIG. 6 illustrates that strap support 25 may be modeled to extend partially along substantially continuous curvature 23, it is also contemplated that strap support 25 may be modeled to fully extend along substantially continuous curvature 23 until strap support 25 is in contact with component 4. Mounting strap 3 then may be modeled to engage the top of strap support 25 and modeled to couple component 4 to mounting bracket 2. Material selection, dimensions, or any other desired design parameters that affect the properties of strap support 25 may be user inputted into product design system 10.

In a similar fashion as in step 404, a finite element model of modified mounting assembly 1' may be generated in step 418. Processor 16 may process the geometric and design data of the modeled and modified mounting assembly 1' developed in step 416 and generate the finite element model.

Analysis of the mounting assembly model (step 300 of FIG. 3) may also include performing a fatigue analysis of the finite element model of modified mounting assembly 1' in a similar fashion as in steps 406 and 408 at step 420. Data related to stress amplitude levels and the number of stress cycles to reach mounting strap 3 failure may be outputted, stored, and/or displayed on display 15. Data related to stress distributions, fatigue sensitive regions, and failure points of mounting strap 3 may also be outputted, stored, and/or displayed on display 15.

As illustrated in FIG. 4, analysis of the mounting assembly model (step 300 of FIG. 3) may also include comparing fatigue data at step 422. In one embodiment, processor 16 may compare the fatigue analysis associated with the mounting assembly 1 model with the fatigue analysis associated with the modified mounting assembly 1' model. Processor 16 may determine if fatigue life and failure modes of mounting strap 3 have improved with modified mounting assembly 1'. For example, processor 16 may determine any changes in stress amplitude levels and the number of stress cycles for mounting strap 3 to reach failure. In addition, changes in stress distribution of mounting strap 3 between the mounting assembly 1 model and the modified mounting assembly 1' model may be identified. Comparative data determined in step 422 may then be utilized for further design modifications of mounting assembly 1 or may be stored in memory module 11 for future use.

INDUSTRIAL APPLICABILITY

The disclosed methods may provide designs for any type of mounting assembly that can be modeled by computer. For example, any mounting assembly having a bracket and a mounting strap configured to couple a component to the bracket may be modeled. Such a mounting strap may engage the bracket and component and include a loosened configuration, wherein the loosened configuration provides a substantially continuous curvature of portions of the mounting strap engaged with the bracket and the component. In one embodiment, it is contemplated that the component may be a diesel particulate filter or a fuel tank; however, it should be appreciated that the component may be any object having a substantially cylindrical shape.

The disclosed modeling method may improve the accuracy of failure mode information associated with mounting assembly 1. In a tightened model of mounting strap 3, mounting strap 3 may include design factors and parameters which model the engagement and tightening of mounting strap 3 to mounting bracket 2 and component 4. Such design factors and parameters may include, for example, bends and discontinuity of mounting strap 3 at portions engaged with first edge 7 and second edge 8 of mounting bracket 2 and portions engaged with component 4 closest to mounting bracket 2. The design factors and parameters of the engaged condition may influence fatigue analysis of mounting strap 3 and provide failure mode data which is not appropriate. For example, the modeled bends of mounting strap 3 may affect the accuracy of the failure mode data of mounting strap 3, such as stress magnitudes, stress distributions and fatigue life. By modeling mounting strap 3 in a loosened configuration, fatigue analysis may be performed from an initial pre-engaged and pre-tightened modeled condition. Therefore, failure analysis of mounting strap 3 may be performed without the influence of design parameters associated with tightening or engaging mounting strap 3 which may interfere with the accuracy of the failure mode information.

The disclosed modeling method may also provide an efficient and simple design to alleviate stress to mounting strap 3. Modeling the loosened configuration of mounting strap 3 may provide parameters for modifying mounting assembly 1 that apply the pre-engaged conditions of the mounting strap 3. For example, modeling the loosened configuration includes generating substantially continuous curvature 9 at portions of mounting strap 3 engaged with mounting bracket 2 and component 4. Substantially continuous curvature 9 provides minimal stress conditions at failure sensitive portions of mounting strap 3. Therefore, to minimize stress at the failure sensitive portions when tightened and engaged against mounting bracket 2 and component 4, mounting strap 3 may be modeled to maintain a curved shape similar to substantially continuous curvature 9. Strap support 25 may be designed based on substantially continuous curvature 9 to maintain the curvature and improve fatigue life of mounting strap 3 at the failure sensitive portions.

It will be apparent to those skilled in the art that various modifications and variations can be made to the modeling method of the present disclosure without departing from the scope of the disclosure. Other embodiments will be apparent to those skilled in the art from consideration of the specification and practice of the embodiments disclosed herein. It is intended that the specification and examples be considered as exemplary only, with a true scope of the disclosure being indicated by the following claims.

What is claimed is:

1. A computer-implemented method for modeling a mounting assembly having a mounting strap configured to couple a component to a bracket, the method comprising:
    modeling, with a computer, a loosened configuration of the mounting strap, wherein the loosened configuration provides a first substantially continuous curvature of portions of the mounting strap engaged with the bracket and the component;
    applying simulated stresses to the mounting strap in the loosened configuration; and
    outputting failure mode information of the mounting strap based on the simulated stresses on the mounting strap.

2. The method of claim 1, wherein modeling the loosened configuration of the mounting strap includes developing a computer aided design model of the mounting assembly based on desired design parameters of the mounting assembly.

3. The method of claim 2, wherein modeling the loosened configuration of the mounting strap further includes generating a finite element model of the mounting strap based on the computer aided design model of the mounting assembly.

4. The method of claim 3, further including determining stress distributions of the mounting strap by performing modal analysis of the finite element model.

5. The method of claim 4, wherein applying simulated stresses to the mounting strap includes applying simulated cycles of vibration to the finite element model.

6. The method of claim 1, further including modifying a design of the mounting assembly based on the configuration of the modeled loosened mounting strap.

7. The method of claim 6, wherein modifying the design of the mounting assembly includes determining a first tangent at a first point of engagement between the mounting strap and the bracket and determining a second tangent at a second point of engagement between the mounting strap and the component.

8. The method of claim 7, further including modeling a strap support for the mounting strap, wherein the strap support is modeled as a function of a second substantially continuous curvature formed between the first and second tangents.

9. A computer-implemented method for modeling a mounting assembly including a mounting strap configured to couple a component to a bracket, the method comprising:
    modeling, with a computer, a loosened configuration of the mounting strap, wherein the loosened configuration provides a first substantially continuous curvature of portions of the mounting strap engaged with the bracket and the component;
    applying simulated stresses to the mounting strap in the loosened configuration;
    outputting failure mode information of the mounting strap based on the simulated stresses on the mounting strap; and
    modifying a design of the mounting assembly based on the configuration of the modeled loosened mounting strap.

10. The method of claim 9, wherein modeling the loosened configuration of the mounting strap includes developing a computer aided design model of the mounting assembly based on desired design parameters of the mounting assembly.

11. The method of claim 10, wherein modifying the design of the mounting assembly includes determining a first tangent at a first point of engagement between the mounting strap and the bracket.

12. The method of claim 11, further including determining a second tangent at a second point of engagement between the mounting strap and the component.

13. The method of claim 12, further including determining an intersection point between the first and second tangents.

14. The method of claim 13, further including forming a second substantially continuous curvature between the first and second tangents as a function of the intersection point.

15. The method of claim 14, further including modeling a strap support for the mounting strap, wherein the strap support is formed as a function of the second substantially continuous curvature.

16. A mounting assembly for mounting a component, comprising:
   a bracket;
   a mounting strap for mounting the component to the bracket; and
   a strap support for coupling the mounting strap to the bracket, the strap support having a curved configuration based on a computer-implemented analysis of the mounting strap in a loosened configuration.

17. The mounting assembly of claim 16, wherein the analysis of the mounting strap includes a computer-implemented model of the mounting strap in the loosened configuration and coupled to the bracket without the strap support, the loosened configuration of the mounting strap providing a first substantially continuous curvature of portions of the mounting strap engaged with the bracket and the component.

18. The mounting assembly of claim 17, wherein the loosened mounting strap model includes a first point of engagement between the mounting strap and the bracket and a second point of engagement between the mounting strap and the component.

19. The mounting assembly of claim 18, wherein the curved configuration of the strap support follows a second substantially continuous curvature formed as a function of an intersection point between a first tangent at the first point of engagement and a second tangent at the second point of engagement.

20. The mounting assembly of claim 19, wherein the strap support extends from a first edge and a second edge of the bracket.

* * * * *